United States Patent
Akenine-Moller et al.

(10) Patent No.: US 10,164,458 B2
(45) Date of Patent: *Dec. 25, 2018

(54) SELECTIVE RASTERIZATION

(71) Applicant: Intel Corporation, Santa Clara, CA (US)

(72) Inventors: Tomas G. Akenine-Moller, Lund (SE); Carl J. Munkberg, Malmo (SE); Franz P. Clarberg, Lund (SE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/492,112

(22) Filed: Apr. 20, 2017

(65) Prior Publication Data

US 2017/0256079 A1    Sep. 7, 2017

Related U.S. Application Data

(63) Continuation of application No. 14/047,079, filed on Oct. 7, 2013, now Pat. No. 9,659,393.

(51) Int. Cl.
  *G06T 11/40* (2006.01)
  *H02J 7/00* (2006.01)
  (Continued)

(52) U.S. Cl.
  CPC .......... *H02J 7/007* (2013.01); *G01R 19/0092* (2013.01); *G06T 11/40* (2013.01);
  (Continued)

(58) Field of Classification Search
  CPC ....... G06T 17/20; G06T 17/205; G06T 15/04; G06T 11/40; G06T 15/005; G06T 15/08;
  (Continued)

(56) References Cited

U.S. PATENT DOCUMENTS

| | | |
|---|---|---|
| 5,325,040 A | 6/1994 | Bogut et al. |
| 5,758,042 A | 5/1998 | Deschuytere |

(Continued)

FOREIGN PATENT DOCUMENTS

| | | |
|---|---|---|
| JP | H11-345349 | 12/1999 |
| JP | 2001162548 A | 6/2001 |

(Continued)

OTHER PUBLICATIONS

Simpson, "Battery Charging," Texas Instruments; Lit. No. SNVA557, LM2576, LM3420, LP2951, LP2952, National Semiconductor, 2011.

(Continued)

*Primary Examiner* — Todd Buttram
(74) *Attorney, Agent, or Firm* — Trop Pruner & Hu, P.C.

(57) ABSTRACT

According to one embodiment, a given tile, made up of pixels or samples, may be of any shape, including a square shape. These pixels may contain colors, depths, stencil values, and other values. Each tile may be further augmented with a single bit, referred to herein as a render bit. In one embodiment, if the render bit is one, then everything is rendered as usual within the tile. However, if the render bit is zero, then nothing is rasterized to this tile and, correspondingly, depth tests, pixel shading, frame buffer accesses, and multi-sampled anti-aliasing (MSAA) resolves are not done for this tile. In other embodiments, some operations may be done nevertheless, but at least one operation is avoided based on the render bit. Of course, the render bits may be switched such that the bit zero indicates that everything should be rendered and the bit one indicates more limited rendering.

20 Claims, 7 Drawing Sheets

(51) Int. Cl.
  *G01R 19/00* (2006.01)
  *H02J 7/02* (2016.01)
  *H02J 7/04* (2006.01)

(52) U.S. Cl.
  CPC .......... *H02J 7/0052* (2013.01); *H02J 7/0055* (2013.01); *H02J 7/025* (2013.01); *H02J 7/045* (2013.01)

(58) Field of Classification Search
  CPC ......... G06T 17/00; G06T 19/00; G06T 15/40; G06T 15/506; G06T 15/50; G06T 15/60; G06T 15/80; G06T 15/06
  See application file for complete search history.

(56) References Cited

U.S. PATENT DOCUMENTS

| | | | |
|---|---|---|---|
| 5,986,437 | A | 11/1999 | Lee |
| 6,222,347 | B1 | 4/2001 | Gong |
| 6,664,959 | B2 | 12/2003 | Duluk et al. |
| 6,894,689 | B1 | 5/2005 | Greene et al. |
| 6,917,124 | B2 | 7/2005 | Shetler et al. |
| 7,379,599 | B1 | 5/2008 | Blais-Morin et al. |
| 7,737,665 | B2 | 6/2010 | Grewe et al. |
| 7,755,331 | B2 | 7/2010 | Kawahara et al. |
| 7,872,450 | B1 | 1/2011 | Cohen et al. |
| 8,138,723 | B2 | 3/2012 | Carkner |
| 8,183,826 | B2 | 5/2012 | Tuffner et al. |
| 8,194,071 | B2 | 7/2012 | Meinds |
| 8,217,962 | B2 | 7/2012 | Tong et al. |
| 9,659,393 | B2 * | 5/2017 | Akenine-Moller ..... G06T 11/40 |
| 2008/0238361 | A1 | 10/2008 | Pinnell |
| 2008/0273043 | A1 | 11/2008 | Tai et al. |
| 2010/0026240 | A1 | 2/2010 | Jiang et al. |
| 2011/0089886 | A1 | 4/2011 | Dubovsky |
| 2011/0090220 | A1 | 4/2011 | Molnar et al. |
| 2011/0115690 | A1 | 5/2011 | Cummings |
| 2011/0148901 | A1 | 6/2011 | Adams |
| 2011/0234609 | A1 | 9/2011 | Cai et al. |
| 2011/0317232 | A1 * | 12/2011 | Aoyagi .................. H04N 19/85 358/518 |
| 2012/0176386 | A1 * | 7/2012 | Hutchins .................. G06T 1/20 345/522 |
| 2012/0194141 | A1 | 8/2012 | Shi |
| 2013/0162200 | A1 | 6/2013 | Terry et al. |
| 2013/0234658 | A1 | 9/2013 | Endo |
| 2014/0192051 | A1 | 7/2014 | Meiri |
| 2014/0354664 | A1 * | 12/2014 | Brown .................. G09G 5/363 345/545 |

FOREIGN PATENT DOCUMENTS

| | | |
|---|---|---|
| JP | 2002-529871 | 9/2002 |
| JP | 2006-510973 | 3/2006 |
| JP | 2008-117384 | 5/2008 |
| JP | 2011-070672 | 4/2011 |
| JP | 2011070672 A | 4/2011 |
| WO | 2008145434 | 12/2008 |

OTHER PUBLICATIONS

Hasselgren, J., et al., "Automatic Pre-Tessellation Culling," ACM Transactions on Graphics, vol. 28, No. 2, Article 19 (2009).
LeFohn, A., et al., Resolution-Matched Shadow Maps, ACM Transactions on Graphics, vol. 26, No. 4, Article 20 (2007).
JP Office Action in corresponding JP application No. 2104-195156 dated Aug. 11, 2015 (8 pages).
JP Office Action in corresponding divisional JP application No. 2017-112325 dated Jul. 3, 2018 (6 pages).
JP Office Action in corresponding divisional JP application No. 2017-112324 dated Jun. 5, 2018 (6 pages).
JP Office Action in corresponding divisional JP application No. 2017-112325 dated Jun. 5, 2018 (5 pages).
JP Office Action in corresponding divisional JP application No. 2016-104517 dated Feb. 6, 2018 (6 pages).

\* cited by examiner

SELECTIVE RASTERIZATION

CROSS-REFERENCE TO RELATED APPLICATIONS

This application is a continuation of U.S. patent application Ser. No. 14/047,079, filed on Oct. 7, 2013.

BACKGROUND

This relates generally to graphics processing and, particularly, to rasterization.

Power and efficiency for graphics processors is important. Substantial efforts have gone into assuring that unnecessary graphics processing operations are avoided. Depth culling is an example of a process for avoiding processing certain parts of a depiction when those parts would be occluded by other parts of the depiction. This saves power and energy and improves the performance of the system.

Commonly, each frame of a plurality of frames making up a video depiction may be rendered one after another. Typically, the entire frame is rendered, even though it is known that, in some cases, portions of the frame do not change from one frame to the other. However, manually keeping track of which regions need updating and rendering only those regions that need updating involves significant bookkeeping and software complexity. In addition, since the programmable stages transform and shade the primitives, identifying regions that need updating often involves a significant amount of work.

BRIEF DESCRIPTION OF THE DRAWINGS

Some embodiments are described with respect to the following figures.

DETAILED DESCRIPTION

According to one embodiment, a given tile, made up of pixels or samples, may be of any shape, including a square or rectangular shape. These pixels may contain colors, depths, stencil values, and other values. Each tile may be further augmented with a single bit, referred to herein as a render bit. In one embodiment, if the render bit is one, then everything is rendered as usual within the tile. However, if the render bit is zero, then nothing is rasterized to this tile and, correspondingly, depth tests, pixel shading, frame buffer accesses, and multi-sampled anti-aliasing (MSAA) resolves are not done for this tile. In other embodiments, some operations may be done nevertheless, but at least one operation is avoided based on the render bit. Of course, the render bits may be switched such that the bit zero indicates that everything should be rendered and the bit one indicates more limited rendering.

In another embodiment, multiple render bits are stored for each tile in order to allow more fine-grained control. For example, the render bits may indicate that a subset of multiple render targets can be reused for the tile.

Then the tiles that are not rendered copy their content or point to the content from the same tile from the previous frame that was rendered.

Thus, according to some embodiments, the rasterization work may be reduced as a whole because rasterization may be reduced for some, even if not all, tiles.

For all the tiles on the screen, the render bits may be stored in a long bitmask. The bitmask may be provided to the graphics architecture and, particularly, to the rasterizer.

Figure 1:
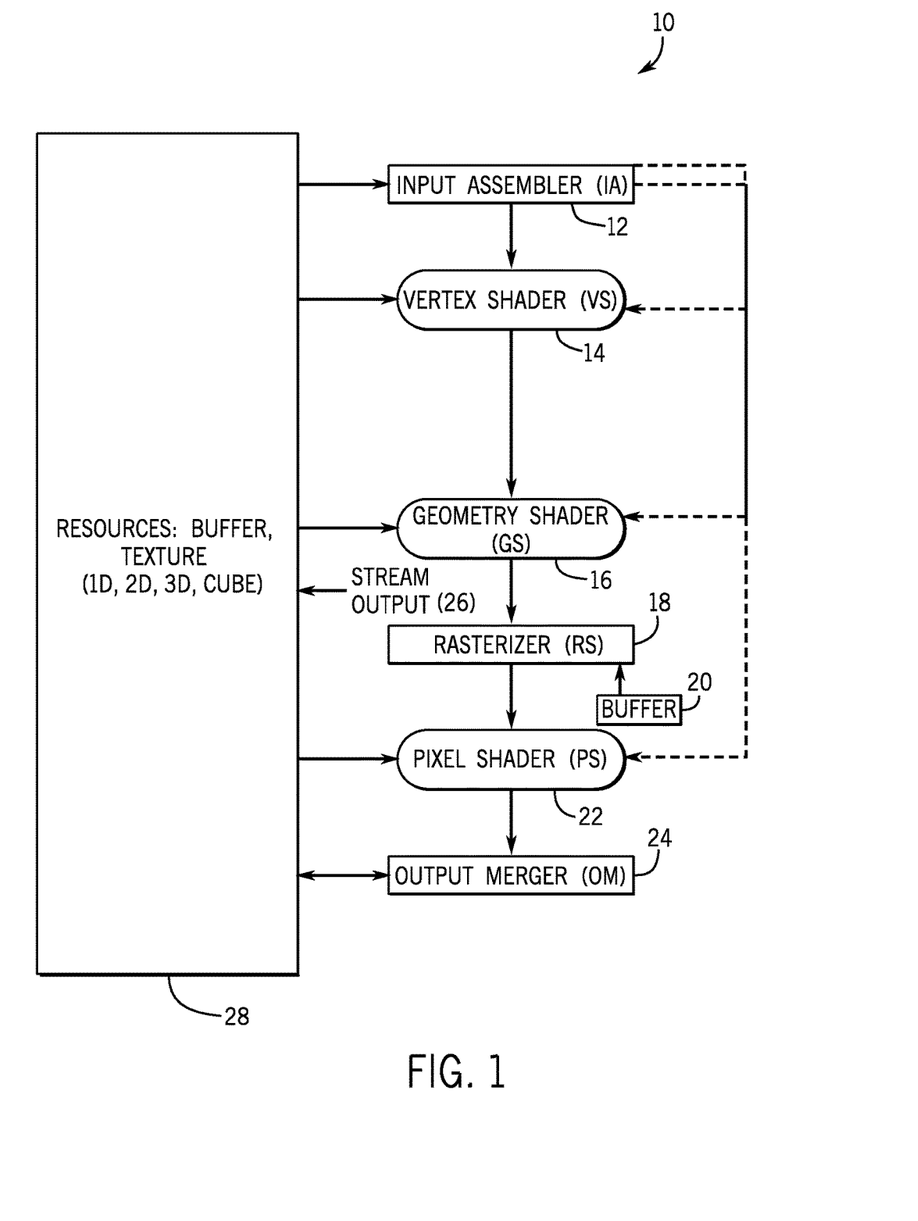
FIG. 1 is a schematic depiction of one embodiment.

Thus, referring to FIG. 1, a graphics pipeline 10 may include an input assembler stage 12. The input assembler stage supplies data, such as triangles, to the pipeline. The vertex shader stage 14 processes vertices. The geometry shader stage 16 processes primitives, such as triangles. The stream output stage 26 streams primitive data from the pipeline to memory 28 on its way to the rasterizing stage 18. The rasterizer stage 18 determines which pixels primitives overlap, clips primitives and prepares primitives for the pixel shader and determines how to invoke the pixel shader stage 22. The pixel shader stage receives interpolated data for a primitive and generates per-pixel data, such as color. Finally, the output merger stage 24 combines various types of output data, such as pixel shader values, depth, and stencil information with the contents of a render target and depth/stencil buffers to generate the final pipeline result. The rasterizer stage 18 may include a buffer 20 for storing the render bits. Other graphics pipelines may also be used in other embodiments.

Commonly, hierarchical rasterization is used when traversing triangles. One common hierarchical rasterization technique is to project the vertices of the triangle to be rendered on the image plane and then compute a two-dimensional bounding box of the projected triangle. All tiles that are partially or fully inside this box are then visited in some order. Typically, then smaller tiles inside each bigger tile may be visited and so on, until the pixel level is reached, usually by terminating the traversal at some small tile size.

According to one embodiment, the rasterizer stage 18 is modified so that when a given tile size of render bits is reached during hierarchical rasterization, the render bit of a tile is tested first. For example, one useful tile size for this purpose may be 32×32 pixels or samples. If the corresponding render bit is zero, then the rasterization and any further processing of that triangle, in that tile, is terminated. However, for tiles that have the other render bit setting, rendering continues as usual.

Thus, when large regions are the same from frame to frame, rasterization may be reduced. This results in tiles that do not generate any new results at all, while some tiles still get rendered as usual. For example, a given primitive, such as a triangle, may span more than one tile and may be rendered only in less than all of those tiles. The decision as to which parts of the primitive to render may be governed by the render bit.

Unlike stencil operations, this operation is done per tile, not per sample. In addition, this render bit test is done during rasterization and, hence, before pixel shading, depth testing, and alpha testing. This makes the test faster, as it does not waste any compute or any memory bandwidth and, hence, wastes no power, since just testing a bit per tile, per triangle, must be considered close to zero in power usage.

Generally, the vertex positions are known in order to traverse a triangle and determine which tiles need further processing. Therefore, in one embodiment, only the position part of the vertex shader is executed at first and the vertex attribute shading is delayed. The triangle is then hierarchically rasterized down to the tile resolution and the render bits of all overlapping tiles are checked. If no render bit with value "one" are found, the entire triangle can be discarded and it is unnecessary to perform the vertex attribute shading and it is also unnecessary to perform triangle/interpolation set up. If at least one render bit with the value "one" is found, the rasterization proceeds as usual.

As still another embodiment, the render bits in all tiles overlapping the bounding box of a triangle are checked first, before proceeding with triangle set up and vertex attribute shading if at least one render bit in state one is found. This may be used as a first test to quickly cull triangles that do not need to be rendered.

Figure 2:
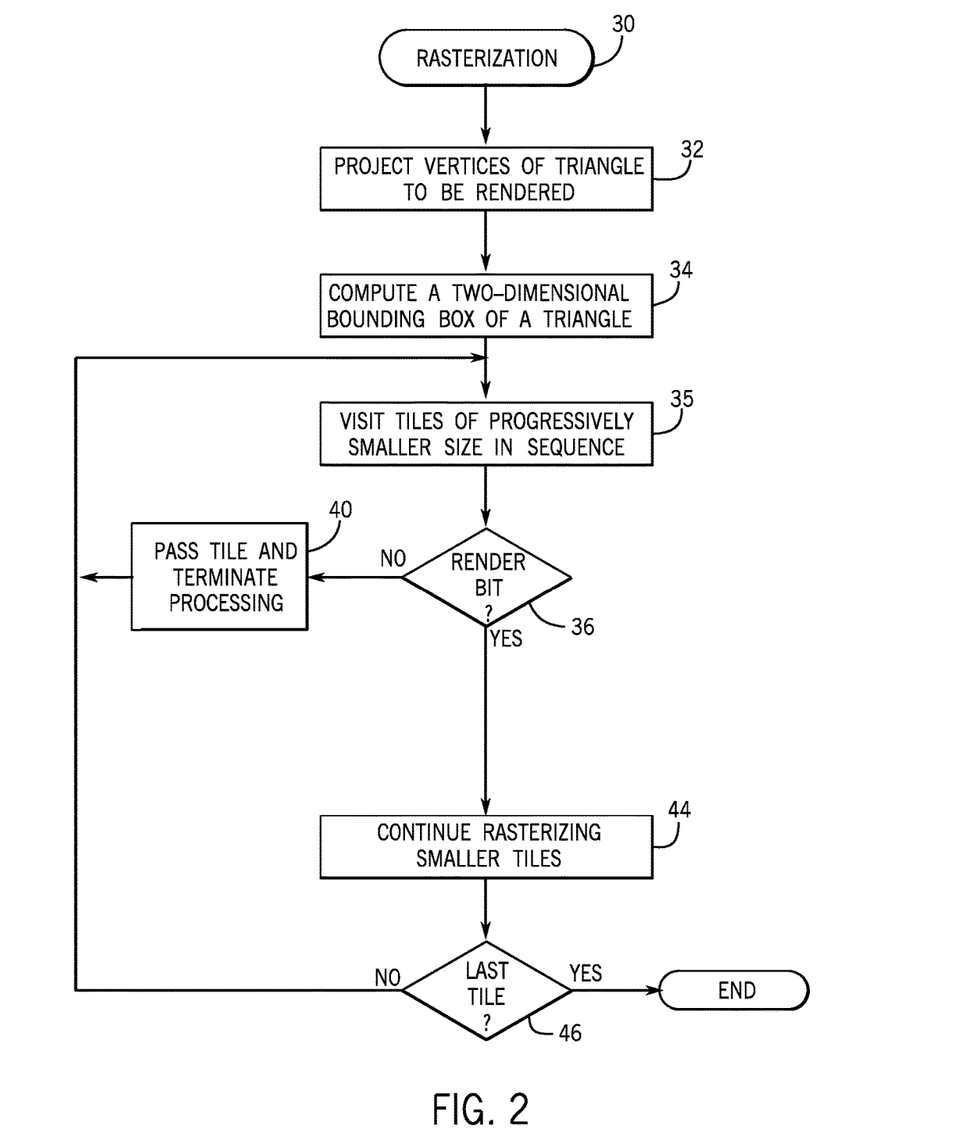
FIG. 2 is a flow chart for a rasterization sequence according to one embodiment.

Thus, referring to FIG. 2, a rasterization sequence 30 may be implemented in software, firmware, and/or hardware. In software and firmware embodiments, it may be implemented by computer executed instructions stored in one or more non-transitory computer readable media, such as a magnetic, optical, or semiconductor storage.

The rasterization sequence 30 begins, in one embodiment, by projecting the vertices of the triangle to be rendered, as indicated in block 32, and computing a two-dimensional bounding box of a triangle, as indicated in block 34. However, other forms of hierarchical rasterization may also be used.

Then the tiles may be visited progressively within a bounding box, checking at each tile size for a render bit. In other words, tiles of progressively smaller size are visited one after the other, as indicated in block 35. A check at diamond 36 determines whether a render bit has been identified. If not, the tiles are passed, processing is terminated (block 40) and tiles are visited progressively on a continuing basis until a render bit is detected. When a render bit is detected, rasterization continues with progressively smaller tiles, as indicated in block 44, until the last tile is identified, according to diamond 46.

A variety of different techniques may be utilized to generate the render bits. For example, the user can set these bits using an application program interface (API) call or extension to an existing application program interface call. In accordance with still another embodiment, the user may provide a bounding volume and a Boolean per draw call or some other group of geometry. The Boolean signals whether anything in the draw call, the current pipeline state and all attached resources (such as texture buffers) and varying inputs have changed since the last frame. For example, a texture, animation parameter or shader code, vertex buffers or transform may change. In addition, there may be another Boolean for signaling whether the camera transform has changed and if any post-processing passes are used. The render bits can then be computed from this information and fed to the graphics architecture.

One problem here is that even if a single pixel changes anywhere on-screen, a histogram-based tone-mapping post-processing pass may be slightly different, which means that all tiles on screen will have slightly different values, and no tiles can be reused. Any post-processing pass that analyses all pixels to determine a parameter may potentially make all render bits false. One way to avoid this problem is to store a copy of the unprocessed frame buffer from the previous frame, and apply post-processing passes after the render bit based tile copying has been applied.

Figure 3:
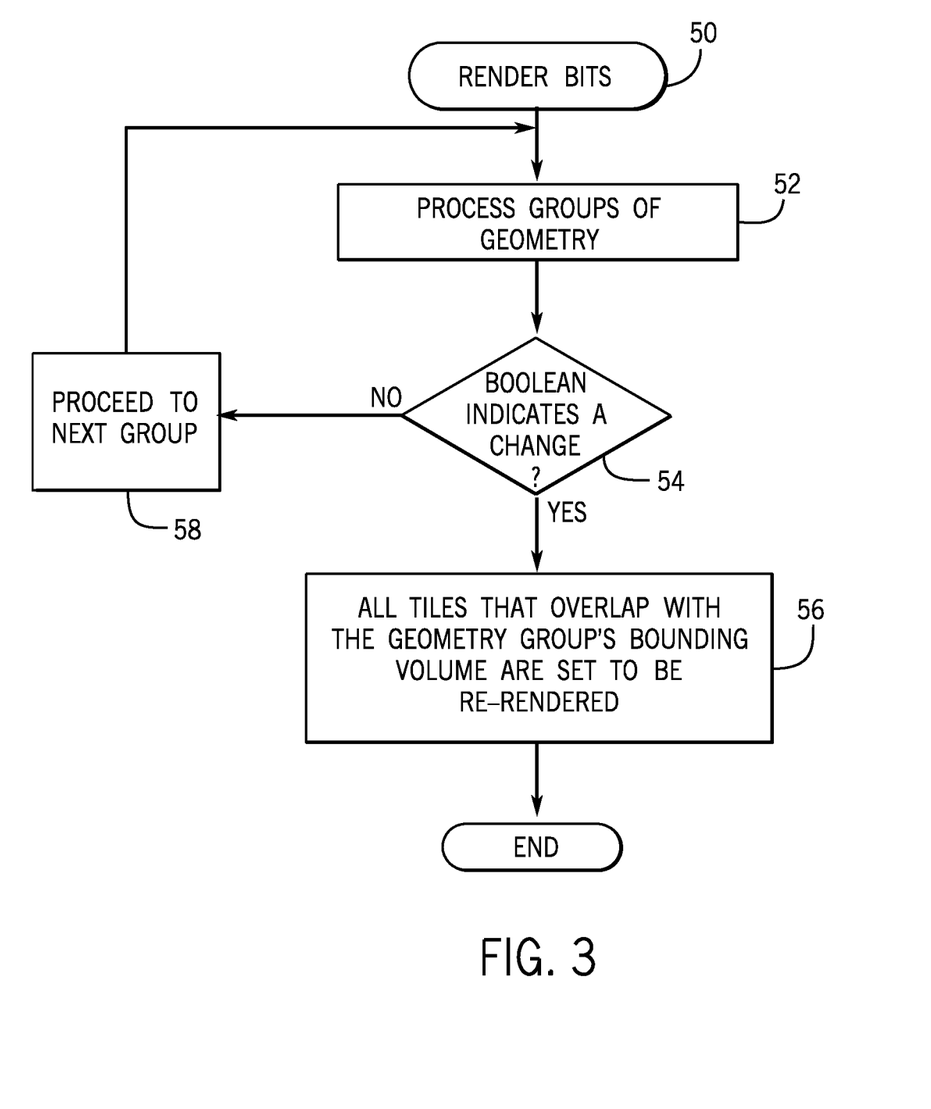
FIG. 3 is a flow chart for a sequence for computing rendering bits according to one embodiment.

Thus, referring to FIG. 3, a sequence 50 may be implemented in software, firmware, and/or hardware. In software and firmware embodiments, it may be implemented by computer executed instructions stored in one or more non-transitory computer readable media, such as a magnetic, optical, or semiconductor storage. Software and firmware implemented embodiments may be stored within memory associated with the graphics processor, according to one embodiment.

As indicated in block 52, groups of geometry are processed one at a time. For each group, a check determines whether the Boolean indicates a change from the previous frame, as indicated in diamond 54. If so, all the tiles that overlap with the geometry group's bounding volume for the previous and current frame are set to be re-rendered, as indicated in block 56. Otherwise, the tile may be skipped if no overlapping geometry group indicates a change from a previous frame and the flow proceeds to the next group, as indicated in block 58. A tile may not be skipped based on only one geometry group, as a subsequent geometry group may overlap the same tile and set a render bit of one. The decision to skip a tile can be made first when all geometry groups have been processed (unless the render bits were generated in a previous step). After iterating over all geometry groups, all render bits have been set.

Each group of geometries, such as a draw call, is processed one at a time. If the Boolean of the geometry group indicates that nothing has changed, then the flow proceeds to the next geometry group. On the other hand, if the Boolean indicates that something has changed, then all tiles that overlap with the geometry group's bounding volumes for the both previous frame and the current frame are set to one. This makes sure that the tiles are re-rendered where the geometry group was located in the previous frame because their content may have changed and tiles where the geometry group was located in the current frame are also re-rendered. This ensures that the correct part of the image is updated in order to generate an image that is exactly the same as the image rendered without this technique.

In accordance with still another embodiment, the graphics driver keeps track of the rendering state and automatically computes the Booleans, as described in FIG. 3.

Figure 4:
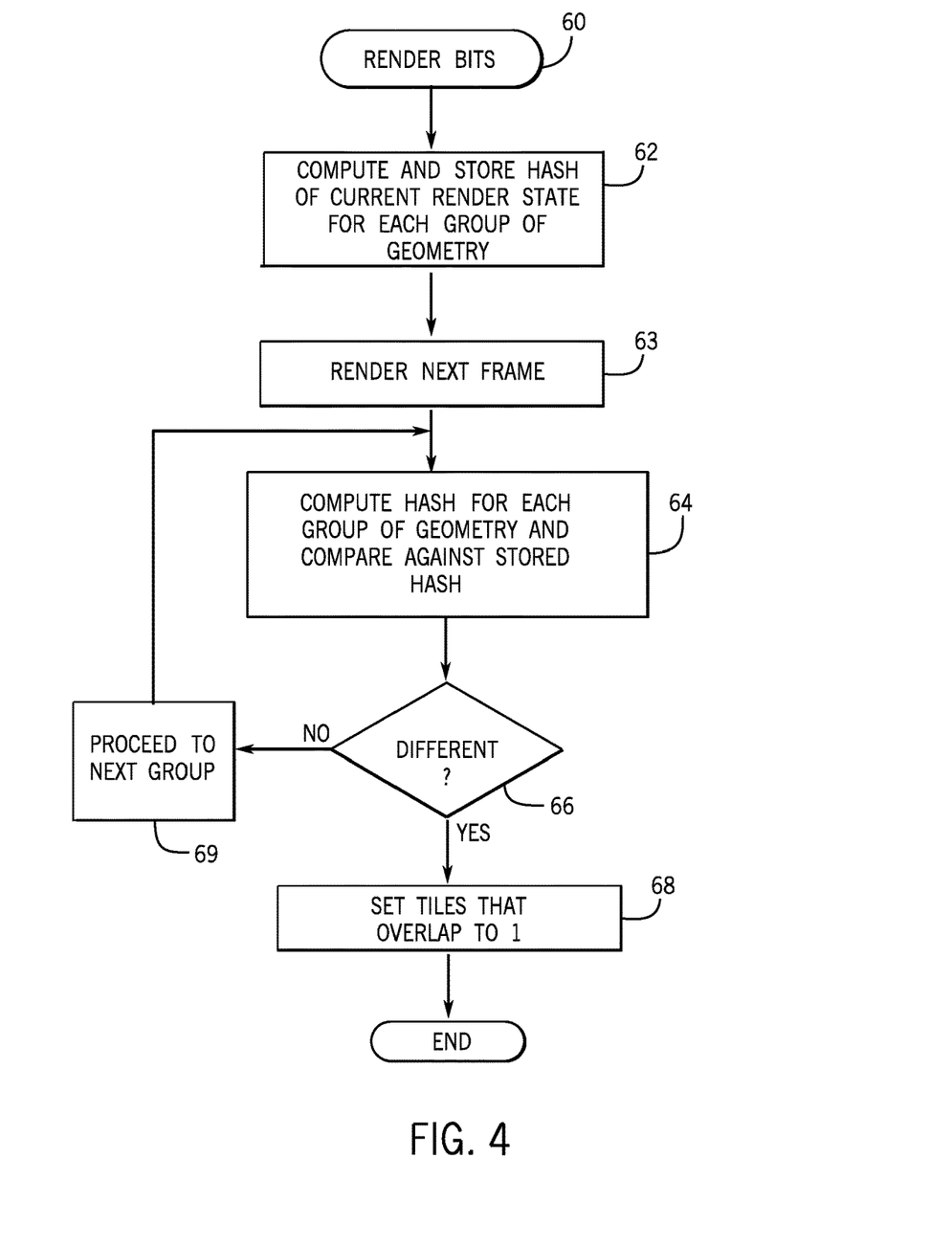
FIG. 4 is a flow chart for a sequence of computing rendering bits in accordance with another embodiment.

Referring to FIG. 4, a sequence 60 for generating render bits may be implemented in software, firmware, and/or hardware. In software and firmware embodiments, it may be implemented by computer executed instructions stored in one or more non-transitory computer readable media, such as a magnetic, optical, or semiconductor storage.

During rendering of a frame, a driver and/or hardware may compute and store a hash of the current render state for each group of geometry (block 62). The hash may be based, for example, on shaders, textures, samplers, or constant buffers, to mention a few examples. The geometry may, for example, be a draw call. The next frame is rendered (block 63). Then, for the subsequent frame, a corresponding hash is computed for each group of geometry and compared against the stored hash from the last frame (block 64). If the hashes are different (diamond 66), all the tiles that overlap with the geometry group's bounding volumes for both the previous frame and the current frame are set to one, as previously (block 68) and otherwise (block 69) the flow iterates. Note that the ordering may take into account, for example, if two draw calls have the same hash, but occur in different order, they are still re-rendered.

Figure 5:
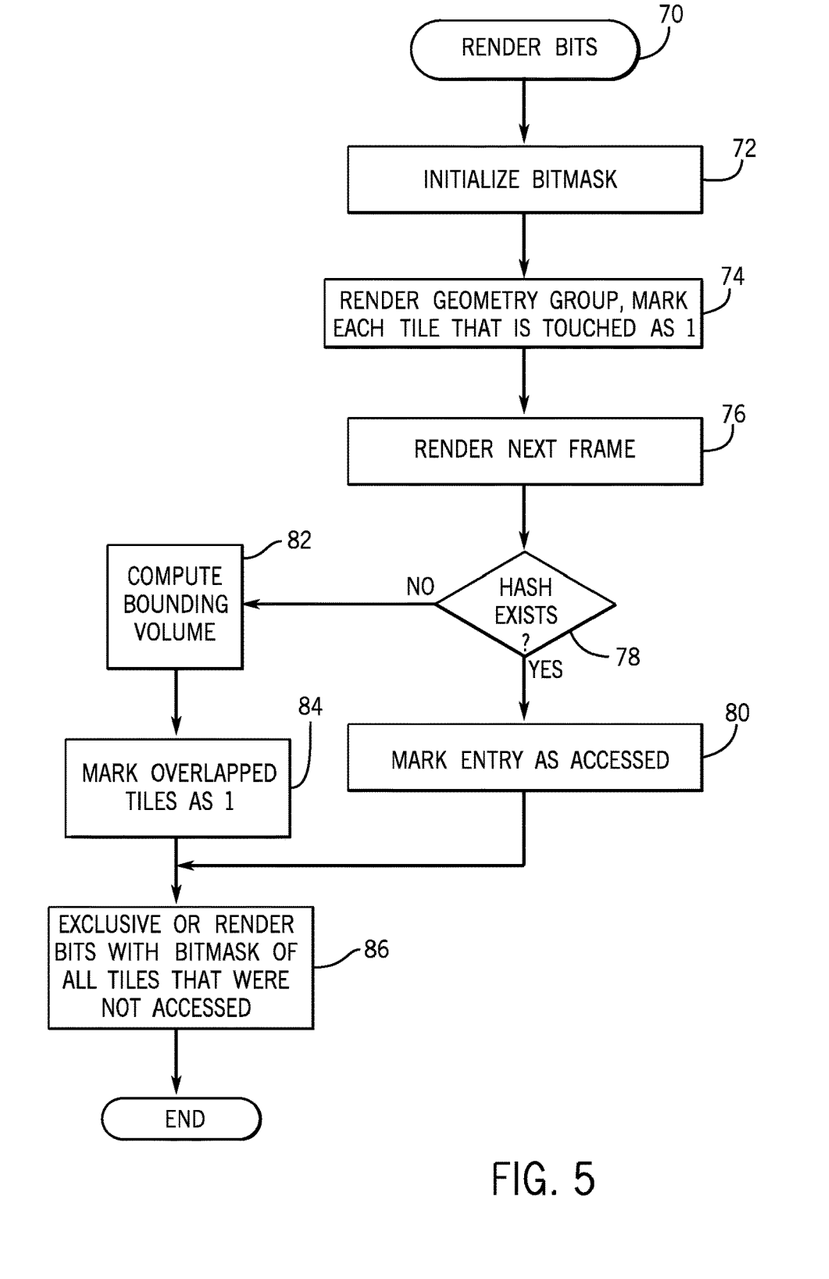
FIG. 5 is a flow chart for a sequence of computing rendering bits in accordance with still another embodiment.

Referring to FIG. 5, a sequence 70 may be implemented in software, firmware and/or hardware. In software and firmware embodiments, it may be implemented by computer executed instructions stored in one or more non-transitory computer readable media, such as magnetic, optical, or semiconductor storages.

According to one embodiment, the driver or hardware during the rendering of a frame and for each group of geometry computes a hash of the current render state and a bitmask of render bits. The bitmask is initialized as zero (block 72) and, during rendering of the geometry group, each tile that is touched is marked as one (block 74). During rendering of the next frame (block 76), if the hash exists in the list (diamond 78), the entry for the corresponding tile is marked as accessed (block 80). If it does not exist, the bounding volume is computed (block 82), for example, by vertex position shading and all overlapped tiles are marked as one (block 84). In addition, the render bits for all entries that were not accessed are ORed with the bit mask of all tiles that were not accessed (block 86), as these indicate regions that have potentially changed.

Hence, bounding boxes for the previous frame are not needed. The computed render bits may also be more accurate since the mask from the previous frame represents the tiles that are actually touched and not just what the bounding volumes overlapped.

To compute the render bits, all draw calls for the current frame are made available and processed, as described according to one of the methods of FIGS. 3-5. After this is done, rendering of the frame starts. This may introduce some additional latency, since rendering cannot commence until a complete frame has been submitted to the driver. In the case where all render bits are set to zero, the entire frame can be skipped and the previous frame reused.

In order to compute the render bits using one of the above methods, bounding volumes for each group of geometry may be needed. In the sequence shown in FIG. 5, only bounding volumes for the current frame are needed, while in the sequences of FIGS. 3 and 4, bounding volumes for both the previous and current frames are used. One option is to let the user supply these through an extension to current graphics application program interfaces. In some cases, such as for an affine vertex shader and no geometry/domain shader, bounding volumes may be automatically computed by transforming bounding boxes for the geometry. In other cases, it may be desirable to execute vertex position shading to compute bounds. In some other cases, automatic methods may be used. See J. Hasselgren, J. Munkberg, T. Akenine-Moller "Automatic Pre-Tessellation Culling," ACM Transactions on Graphic, 28 (2) pages 19:1-19:10, 2009.

There are also other uses for these techniques. For example, in connection with rendering shadows using cascaded shadow maps, a shadow map may be generated on a graphics processing unit using an optimized depth map rasterizer. First, the tiles in each shadow map that will be accessed during the render pass from the eye point are determined. This may be done by projecting the pixel footprints as seen from the eye to the shadow map space, and selecting an appropriate shadow map resolution per pixel. This selects a number of tiles in each shadow map that need to be rendered to. The rest of the tiles do not need to be rendered to since they will not be accessed when doing the shadow map lookups. The only way to currently exploit this is to render the shadow map on the central processing unit. However, with the techniques described herein, the render bits may be generated and set to one for tiles where a corresponding shadow map is accessed. This may speed up the rendering of the shadow map substantially. In addition, compression can be used for the shadow map, which may reduce memory bandwidth, in some embodiments.

Figure 6:
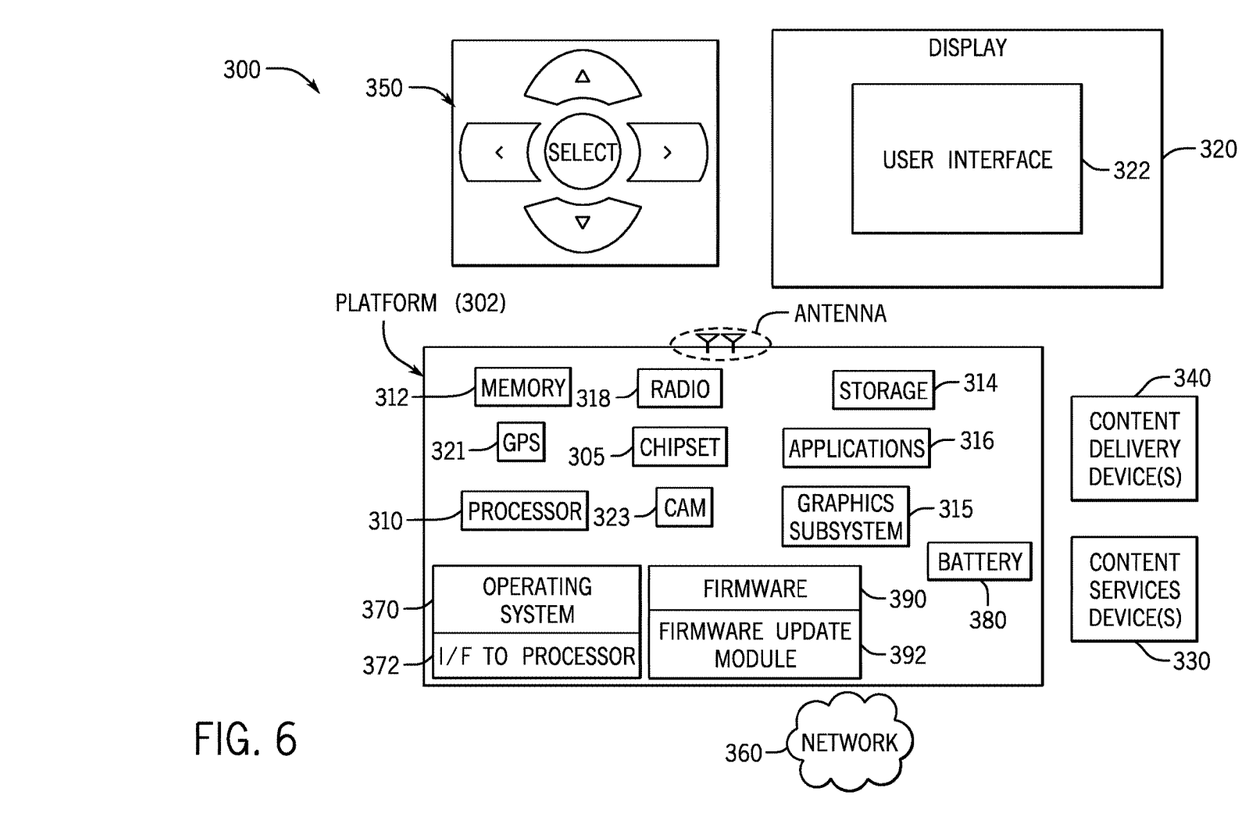
FIG. 6 is a system depiction for one embodiment.

FIG. 6 illustrates an embodiment of a system 300. In embodiments, system 300 may be a media system although system 300 is not limited to this context. For example, system 300 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 300 comprises a platform 302 coupled to a display 320. Platform 302 may receive content from a content device such as content services device(s) 330 or content delivery device(s) 340 or other similar content sources. A navigation controller 350 comprising one or more navigation features may be used to interact with, for example, platform 302 and/or display 320. Each of these components is described in more detail below.

In embodiments, platform 302 may comprise any combination of a chipset 305, processor 310, memory 312, storage 314, graphics subsystem 315, applications 316 and/or radio 318. Chipset 305 may provide intercommunication among processor 310, memory 312, storage 314, graphics subsystem 315, applications 316 and/or radio 318. For example, chipset 305 may include a storage adapter (not depicted) capable of providing intercommunication with storage 314.

Processor 310 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor 310 may comprise dual-core processor(s), dual-core mobile processor(s), and so forth. The processor may implement the sequences of FIGS. 1-5 together with memory 312.

Memory 312 may be implemented as a volatile memory device such as, but not limited to, a Random Access Memory (RAM), Dynamic Random Access Memory (DRAM), or Static RAM (SRAM).

Storage 314 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 314 may comprise technology to increase the storage performance enhanced protection for valuable digital media when multiple hard drives are included, for example.

Graphics subsystem 315 may perform processing of images such as still or video for display. Graphics subsystem 315 may be a graphics processing unit (GPU) or a visual processing unit (VPU), for example. An analog or digital interface may be used to communicatively couple graphics subsystem 315 and display 320. For example, the interface may be any of a High-Definition Multimedia Interface, DisplayPort, wireless HDMI, and/or wireless HD compliant techniques. Graphics subsystem 315 could be integrated into processor 310 or chipset 305. Graphics subsystem 315 could be a stand-alone card communicatively coupled to chipset 305.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 318 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 318 may operate in accordance with one or more applicable standards in any version.

In embodiments, display 320 may comprise any television type monitor or display. Display 320 may comprise, for example, a computer display screen, touch screen display, video monitor, television-like device, and/or a television. Display 320 may be digital and/or analog. In embodiments, display 320 may be a holographic display. Also, display 320 may be a transparent surface that may receive a visual projection. Such projections may convey various forms of information, images, and/or objects. For example, such projections may be a visual overlay for a mobile augmented reality (MAR) application. Under the control of one or more software applications 316, platform 302 may display user interface 322 on display 320.

In embodiments, content services device(s) 330 may be hosted by any national, international and/or independent service and thus accessible to platform 302 via the Internet, for example. Content services device(s) 330 may be coupled to platform 302 and/or to display 320. Platform 302 and/or content services device(s) 330 may be coupled to a network 360 to communicate (e.g., send and/or receive) media information to and from network 360. Content delivery device(s) 340 also may be coupled to platform 302 and/or to display 320.

In embodiments, content services device(s) 330 may comprise a cable television box, personal computer, network, telephone, Internet enabled devices or appliance capable of delivering digital information and/or content, and any other similar device capable of unidirectionally or bidirectionally communicating content between content providers and platform 302 and/display 320, via network 360 or directly. It will be appreciated that the content may be communicated unidirectionally and/or bidirectionally to and from any one of the components in system 300 and a content provider via network 360. Examples of content may include any media information including, for example, video, music, medical and gaming information, and so forth.

Content services device(s) 330 receives content such as cable television programming including media information, digital information, and/or other content. Examples of content providers may include any cable or satellite television or radio or Internet content providers.

In embodiments, platform 302 may receive control signals from navigation controller 350 having one or more navigation features. The navigation features of controller 350 may be used to interact with user interface 322, for example. In embodiments, navigation controller 350 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 350 may be echoed on a display (e.g., display 320) by movements of a pointer, cursor, focus ring, or other visual indicators displayed on the display. For example, under the control of software applications 316, the navigation features located on navigation controller 350 may be mapped to virtual navigation features displayed on user interface 322, for example. In embodiments, controller 350 may not be a separate component but integrated into platform 302 and/or display 320. Embodiments, however, are not limited to the elements or in the context shown or described herein.

In embodiments, drivers (not shown) may comprise technology to enable users to instantly turn on and off platform 302 like a television with the touch of a button after initial boot-up, when enabled, for example. Program logic may allow platform 302 to stream content to media adaptors or other content services device(s) 330 or content delivery device(s) 340 when the platform is turned "off." In addition, chip set 305 may comprise hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 300 may be integrated. For example, platform 302 and content services device(s) 330 may be integrated, or platform 302 and content delivery device(s) 340 may be integrated, or platform 302, content services device(s) 330, and content delivery device(s) 340 may be integrated, for example. In various embodiments, platform 302 and display 320 may be an integrated unit. Display 320 and content service device(s) 330 may be integrated, or display 320 and content delivery device(s) 340 may be integrated, for example.

In various embodiments, system 300 may be implemented as a wireless system, a wired system, or a combination of both. When implemented as a wireless system, system 300 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 300 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 302 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 5.

As described above, system 300 may be embodied in varying physical styles or form factors. FIG. 6 illustrates embodiments of a small form factor device 400 in which system 300 may be embodied. In embodiments, for example, device 400 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

The processor 310 may communicate with a camera 322 and a global positioning system sensor 320, in some embodiments. A memory 312, coupled to the processor 310, may store computer readable instructions for implementing the sequences shown in FIGS. 2-5 in software and/or firmware embodiments.

Figure 7:
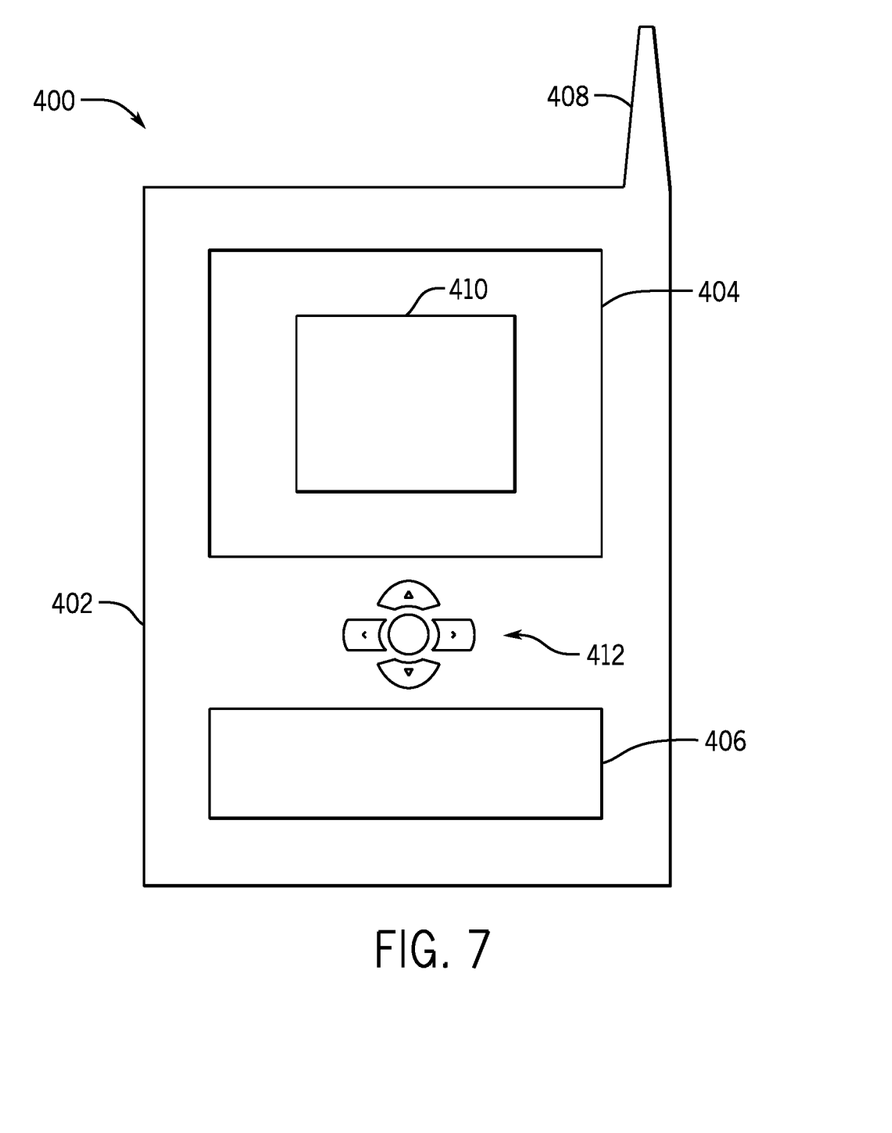
FIG. 7 is a front elevational view of one embodiment.

As shown in FIG. 7, device 400 may comprise a housing 402, a display 404, an input/output (I/O) device 406, and an antenna 408. Device 400 also may comprise navigation features 412. Display 404 may comprise any suitable display unit for displaying information appropriate for a mobile computing device. I/O device 406 may comprise any suitable I/O device for entering information into a mobile computing device. Examples for I/O device 406 may include an alphanumeric keyboard, a numeric keypad, a touch pad, input keys, buttons, switches, rocker switches, microphones, speakers, voice recognition device and software, and so forth. Information also may be entered into device 400 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

The following clauses and/or examples pertain to further embodiments:

One example embodiment may be a method comprising electronically organizing pixels or samples into tiles, and electronically indicating for each of a plurality of tiles, whether to complete all of a plurality of rasterization operations in a rasterizer or, alternatively, whether at least one operation in the rasterizer is to be omitted for a given tile. The method may also include indicating whether to render a tile at all and including indicating before rasterization on a tile level. The method may also include using content from the same tile in a previous frame in place of a tile in the current frame if rasterization of the tile is not to be done. The method may also include using a bit associated with each tile for said indicating and using a hash of a render state to detect rendering changes in a tile. The method may also include storing the indicating bit for a frame in a bitmask for use by the rasterizer. The method may also include using hierarchical rasterization with a series of tile sizes. The method may also include associating a bit for said indicating with one particular tile size in said series. The method may also include rendering a position part of a vertex shader first and delaying vertex attribute shading. The method may also include avoiding vertex attribute shading if an indicating bit indicates not to render the tile. The method may also include checking all bits in tiles overlapping a bounding box before proceeding with vertex attribute shading if at least one bit indicates not to rasterize.

Another example embodiment may be at least one non-transitory computer readable medium storing instructions executed to perform a sequence comprising electronically organizing pixels or samples into tiles, and electronically indicating for each of a plurality of tiles, whether to complete all of a plurality of rasterization operations in a rasterizer or, alternatively, whether at least one operation in the rasterizer is to be omitted for a given tile. The medium may include said sequence including indicating whether to render a tile at all and including indicating before rasterization on a tile level. The medium may include said sequence including using content from the same tile in a previous frame in place of a tile in the current frame if rasterization of the tile is not to be done. The medium may include said sequence including using a bit associated with each tile for said indicating and using a hash of a render state to detect rendering changes in a tile. The medium may include said sequence including storing the indicating bit for a frame in a bitmask for use by the rasterizer. The medium may include said sequence including using hierarchical rasterization with a series of tile sizes. The medium may include said sequence including associating a bit for said indicating with one particular tile size in said series. The medium may include said sequence including rendering a position part of a vertex shader first and delaying vertex attribute shading. The medium may include said sequence including avoiding vertex attribute shading if an indicating bit indicates not to render the tile. The medium may include said sequence including checking all bits in tiles overlapping a bounding box before proceeding with vertex attribute shading if at least one bit indicates not to rasterize.

In another example embodiment may be an apparatus comprising a rasterizer to organize pixels or samples into tiles and to indicate for each of a plurality of tiles, whether to complete all of a plurality of rasterization operations or, alternatively, whether at least one rasterization operation is to be omitted for a given file, and a buffer coupled to said rasterizer. The apparatus may include said rasterizer to indicate whether to render a tile at all and including indicating before rasterization on a tile level. The apparatus may include said rasterizer to use content from the same tile in a previous frame in place of a tile in the current frame if rasterization of the tile is not to be done. The apparatus may include said rasterizer to use a bit associated with each tile for said indicating and using a hash of a render state to detect rendering changes in a tile. The apparatus may include said rasterizer to store the indicating bit for a frame in a bitmask for use by the rasterizer. The apparatus may include said rasterizer to use hierarchical rasterization with a series of tile sizes. The apparatus may include said rasterizer to associate a bit for said indicating with one particular tile size in said series. The apparatus may include an operating system, a battery, firmware and a module to update said firmware.

The graphics processing techniques described herein may be implemented in various hardware architectures. For example, graphics functionality may be integrated within a chipset. Alternatively, a discrete graphics processor may be used. As still another embodiment, the graphics functions may be implemented by a general purpose processor, including a multicore processor.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While a limited number of embodiments have been described, those skilled in the art will appreciate numerous modifications and variations therefrom. It is intended that the appended claims cover all such modifications and variations as fall within the true spirit and scope of this disclosure.

What is claimed is:

1. A graphics processing unit comprising:
   first circuitry to:
      organize pixels, generated in response to execution in a draw call, into tiles;
      determine whether a first tile processed after a second tile matches a characteristic of the second tile;
      set a bit to indicate if characteristics of the first and second tiles match;
      if the first tile matches the second tile based on the bit, forego rendering for the first tile;
      if the first tile does not match the prior second tile, based on the bit, render the first tile; and
   second circuitry to determine a hash for a third tile and a fourth tile, and if said hashes match, reduce processing of one of said third and fourth tiles.

2. The graphics processing unit of claim 1 said unit to receive a draw call and to set said bit based on said draw call.

3. The graphics processing unit of claim 1 said unit to set a single bit for each tile.

4. The graphics processing unit of claim 1 said unit to calculate a value for each tile based on data values that represent each tile.

5. A system comprising:
   a graphics processing unit to:
      organize pixels, generated in response to execution in a draw call into tiles;
      determine whether a first tile processed after a second tile matches a characteristic of the second tile;
      set a bit to indicate if characteristics of the first and second tiles match;
      if the first tile matches the second tile based on the bit, forego rendering for the first tile;
      if the first tile does not match the prior second tile, based on the bit, render the first tile;
      determine a hash for a third tile and a fourth tile, and if said hashes match, reduce processing of one of said third and fourth tiles; and
   a storage coupled to said graphics processing unit.

6. The system of claim 5 said unit to receive a draw call and to set said bit based on said draw call.

7. The system of claim 5 said unit to set a single bit for each tile.

8. The system of claim 5 said unit to calculate a value for each tile based on data values that represent each tile.

9. The system of claim 5 including a memory controller.

10. The system of claim 5 including a central processing unit.

11. The system of claim 5 including a display.

12. The system of claim 5 including a modem.

13. A method comprising:
   organizing pixels, generated in response to execution in a draw call, into tiles;
   determining whether a first tile processed after a second tile matches a characteristic of the second tile;
   setting a bit to indicate if characteristics of the first and second tiles match;
   if the first tile matches the second tile based on the bit, foregoing rendering for the first tile;
   if the first tile does not match the prior second tile, based on the bit, rendering the first tile; and
   determining a hash for a third tile and a fourth tile, and if said hashes match, reduce processing of one of said third and fourth tiles.

14. The method of claim 13 including receiving a draw call and to set said bit based on said draw call.

15. The method of claim 13 including setting a single bit for each tile.

16. The method of 13 including calculating a value for each tile based on data values that represent each tile.

17. One or more non-transitory computer readable media storing instructions to perform a sequence comprising:
   organizing pixels, generated in response to execution in a draw call, into tiles;
   determining whether a first tile processed after a second tile matches a characteristic of the second tile;
   setting a bit to indicate if characteristics of the first and second tiles match;
   if the first tile matches the second tile based on the bit, foregoing rendering for the first tile;

if the first tile does not match the prior second tile, based on the bit, rendering the first tile; and determining a hash for a third tile and a fourth tile, and if said hashes match, reduce processing of one of said third and fourth tiles.

18. The media of claim 17, further storing instructions to perform a sequence including receiving a draw call and to set said bit based on said draw call.

19. The media of claim 17 including setting a single bit for each tile.

20. The method of 17 including calculating a value for each tile based on data values that represent each tile.

* * * * *